(12) United States Patent
Shen et al.

(10) Patent No.: US 8,541,793 B2
(45) Date of Patent: Sep. 24, 2013

(54) LIGHT EMITTING DIODE DEVICE AND METHOD FOR FABRICATING THE SAME

(76) Inventors: Yu-Nung Shen, Taipei (TW);
Tsung-Chi Wang, Taipei (TW)

( * ) Notice: Subject to any disclaimer, the term of this patent is extended or adjusted under 35 U.S.C. 154(b) by 101 days.

(21) Appl. No.: 13/251,460

(22) Filed: Oct. 3, 2011

(65) Prior Publication Data

US 2012/0018748 A1    Jan. 26, 2012

Related U.S. Application Data

(63) Continuation-in-part of application No. 12/700,062, filed on Feb. 4, 2010, now Pat. No. 8,242,517.

(30) Foreign Application Priority Data

Jan. 31, 2011   (TW) ................................ 99133956 A

(51) Int. Cl.
*H01L 33/60*   (2010.01)

(52) U.S. Cl.
USPC ................. 257/88; 257/79; 257/98; 257/103; 257/E33.058; 257/E33.061

(58) Field of Classification Search
USPC ...... 257/13, 79–103, 918, E51.018–E51.022, 257/E33.001–E33.077, E33.054, E25.028, 257/E25.032
See application file for complete search history.

(56) References Cited

U.S. PATENT DOCUMENTS

| | | | |
|---|---|---|---|
| 2005/0173708 A1* | 8/2005 | Suehiro et al. | 257/79 |
| 2009/0101930 A1* | 4/2009 | Li | 257/98 |
| 2009/0166653 A1* | 7/2009 | Weaver et al. | 257/98 |
| 2009/0261365 A1* | 10/2009 | Brunner et al. | 257/98 |
| 2009/0262526 A1* | 10/2009 | Lin et al. | 362/231 |
| 2010/0118511 A1* | 5/2010 | Wegat | 362/84 |
| 2010/0171413 A1* | 7/2010 | Winkler et al. | 313/486 |
| 2010/0187961 A1* | 7/2010 | Scott | 313/1 |

* cited by examiner

*Primary Examiner* — Mamadou Diallo
(74) *Attorney, Agent, or Firm* — Nixon & Vanderhye P.C.

(57) ABSTRACT

A light emitting diode device includes: at least one light emitting diode chip, which includes a semiconductor unit, two electrodes that are disposed on an electrode-mounting surface of the semiconductor unit, a light-transmissive insulating layer that is disposed on the electrode-mounting surface and that has two via holes, a reflective metal layer disposed on a portion of the light-transmissive insulating layer, a protective insulating layer that is disposed on the reflective metal layer, a conductor-receiving insulating layer that has two conductor-receiving holes respectively in communication with the via holes, and two conductor units that are formed respectively in the conductor-receiving holes; and a light-transmissive envelope layer that covers a surface of the light emitting diode chip opposite to the electrode-mounting surface, that extends to cover outer lateral surfaces of the light emitting diode chip, and that is doped with a fluorescence powder.

20 Claims, 7 Drawing Sheets

LIGHT EMITTING DIODE DEVICE AND METHOD FOR FABRICATING THE SAME

CROSS-REFERENCE TO RELATED APPLICATION

This application is a continuation-in-part (CIP) of U.S. patent application Ser. No. 12/700,062, filed on Feb. 4, 2010 now U.S. Pat. No. 8,242,517, and claims priority of Taiwanese application no. 099133956, filed on Jan. 31, 2011.

BACKGROUND OF THE INVENTION

1. Field of the Invention

This invention relates to a light emitting diode device and a method for fabricating the same.

2. Description of the Related Art

From the beginning of mass production of white-light light emitting diodes (LEDs) by Nichia Corporation in 1996, global LED manufactures have devoted much effort to the research and development of the white-light LEDs. Up to now, the structures of the white-light LEDs on the market are similar to that made by Nichia Corporation. However, the white-light LEDs have some drawbacks as illustrated in Taiwan patent application publication no. 201031021, in which a light-transmissive envelope layer for encapsulating an LED chip is arc-shaped.

SUMMARY OF THE INVENTION

Therefore, an object of the present invention is to provide a light emitting diode device and a method for fabricating the same that can overcome the aforesaid drawbacks associated with the prior art.

According to a first aspect of this invention, alight emitting diode device comprises:

at least one light emitting diode chip, which includes a semiconductor unit that has p-type and n-type electrode regions, two electrodes that are disposed on an electrode-mounting surface of the semiconductor unit and that are connected respectively and electrically to the p-type and n-type electrode regions, a light-transmissive insulating layer that is disposed on the electrode-mounting surface and that has two via holes each of which exposes a respective one of the two electrodes, a reflective metal layer disposed on a portion of the light-transmissive insulating layer corresponding to the p-type electrode region, a protective insulating layer that is disposed on the reflective metal layer and that extends to the electrode-mounting surface, a conductor-receiving insulating layer that has two conductor-receiving holes respectively in communication with the via holes, and two conductor units that are formed respectively in the conductor-receiving holes and are connected electrically and respectively to the two electrodes; and a light-transmissive envelope layer that covers a surface of the light emitting diode chip opposite to the electrode-mounting surface, that extends to cover outer lateral surfaces of the light emitting diode chip, and that is doped with a fluorescence powder.

According to a second aspect of this invention, a light emitting diode device comprises:

at least one light emitting diode chip, which includes a semiconductor unit that has p-type and n-type electrode regions, two electrodes that are disposed on an electrode-mounting surface of the semiconductor unit and that are connected respectively and electrically to the p-type and n-type electrode regions, a light-transmissive insulating layer that is disposed on the electrode-mounting surface and that has two via holes each of which exposes a respective one of the two electrodes, a reflective metal layer disposed on the light-transmissive insulating layer, a protective insulating layer that is disposed on a portion of the reflective metal layer corresponding to the n-type electrode region, and that has an electrode-exposing hole to expose one of the electrodes at the n-type electrode region, a conductor-receiving insulating layer that has two conductor-receiving holes respectively in communication with the via holes, and two conductor units that are formed respectively in the conductor-receiving holes and are connected electrically and respectively to the two electrodes; and a light-transmissive envelope layer that covers a surface of the light emitting diode chip opposite to the electrode-mounting surface, that extends to cover outer lateral surfaces of the light emitting diode chip, and that is doped with a fluorescence powder.

According to a third aspect of this invention, a light emitting diode device comprises:

at least one light emitting diode chip, which includes a semiconductor unit that has p-type and n-type electrode regions, two electrodes that are disposed on an electrode-mounting surface of the semiconductor unit and that are connected respectively and electrically to the p-type and n-type electrode regions, a light-transmissive insulating layer that is disposed on the electrode-mounting surface and that has two via holes each of which exposes a respective one of the two electrodes, a conductor-receiving insulating layer that is formed on the light-transmissive insulating layer and that has two conductor-receiving holes respectively in communication with the via holes, two conductor units that are formed respectively in the conductor-receiving holes and are connected electrically and respectively to the two electrodes, a passivation layer that is disposed on the conductor-receiving insulating layer and that has two conductor-exposing holes to partially and respectively expose the conductor units, and two solder balls that are respectively and electrically connected to the conductor units through the conductor-exposing holes; and a light-transmissive envelope layer that covers a surface of the light emitting diode chip opposite to the electrode-mounting surface, that extends to cover outer lateral surfaces of the light emitting diode chip, and that is doped with a fluorescence powder.

According to a fourth aspect of this invention, a method for fabricating light emitting diode devices comprises:

providing a plurality of light emitting diode chips, each of which includes a semiconductor unit that has p-type and n-type electrode regions, two electrodes that are disposed on an electrode-mounting surface of the semiconductor unit and that are connected respectively and electrically to the p-type and n-type electrode regions, a light-transmissive insulating layer that is disposed on the electrode-mounting surface and that has two via holes each of which exposes a respective one of the two electrodes, a conductor-receiving insulating layer that is formed on the light-transmissive insulating layer and that has two conductor-receiving holes respectively in communication with the via holes, and two conductor units that are formed respectively in the conductor-receiving holes and are connected electrically and respectively to the two electrodes;

arranging the light emitting diode chips on a supporting face of a supporting body in a matrix;

forming over the supporting face of the supporting body a light-transmissive envelope layer that is doped with a fluorescence powder so as to cover all of the light emitting diode chips;

removing the supporting body to expose and permit the conductor units to connect to an external circuit; and performing a cutting process to obtain light emitting diode devices each having at least one of the light emitting diode chips.

According to a fifth aspect of this invention, a method for fabricating light emitting diode devices comprises:

providing a plurality of light emitting diode chips, each of which includes a semiconductor unit that has p-type and n-type electrode regions, two electrodes that are disposed on an electrode-mounting surface of the semiconductor unit and that are connected respectively and electrically to the p-type and n-type electrode regions, a light-transmissive insulating layer that is disposed on the electrode-mounting surface and that has two via holes each of which exposes a respective one of the two electrodes, a reflective metal layer disposed on the light-transmissive insulating layer, a protective insulating layer that is disposed on a portion of the reflective metal layer corresponding to the n-type electrode region, and that has an electrode-exposing hole to expose one of the electrodes at the n-type electrode region, a conductor-receiving insulating layer that has two conductor-receiving holes respectively in communication with the via holes, and two conductor units that are formed respectively in the conductor-receiving holes and are connected electrically and respectively to the two electrodes;

arranging the light emitting diode chips on a supporting face of a supporting body in a matrix;

forming over the supporting face of the supporting body a light-transmissive envelope layer that is doped with a fluorescence powder so as to cover all of the light emitting diode chips;

removing the supporting body to expose and permit the conductor units to connect to an external circuit; and performing a cutting process to obtain light emitting diode devices each having at least one of the light emitting diode chips.

According to a sixth aspect of this invention, a method for fabricating light emitting diode devices comprises:

providing a plurality of light emitting diode chips, each of which includes a semiconductor unit that has p-type and n-type electrode regions, two electrodes that are disposed on an electrode-mounting surface of the semiconductor unit and that are connected respectively and electrically to the p-type and n-type electrode regions, a light-transmissive insulating layer that is disposed on the electrode-mounting surface and that has two via holes each of which exposes a respective one of the two electrodes, a conductor-receiving insulating layer that is formed on the light-transmissive insulating layer and that has two conductor-receiving holes respectively in communication with the via holes, two conductor units that are formed respectively in the conductor-receiving holes and are connected electrically and respectively to the two electrodes, a passivation layer that is disposed on the conductor-receiving insulating layer and that has two conductor-exposing holes to partially and respectively expose the electrodes, and two solder balls that are connected electrically and respectively to the conductor units through the conductor-exposing holes, one of the conductor-receiving holes, which is connected to the electrode in the p-type electrode region, exposing a portion of the light-transmissive insulating layer situated above the p-type electrode region so that one of the conductor units formed in said one of the conductor-receiving holes is able to serve as a reflective metal layer;

arranging the light emitting diode chips on a supporting face of a supporting body in a matrix;

forming over the supporting face of the supporting body a light-transmissive envelope layer that is doped with a fluorescence powder so as to coverall of the light emitting diode chips;

removing the supporting body to expose and permit the conductor units to connect to an external circuit; and performing a cutting process to obtain light emitting diode devices each having at least one of the light emitting diode chips.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
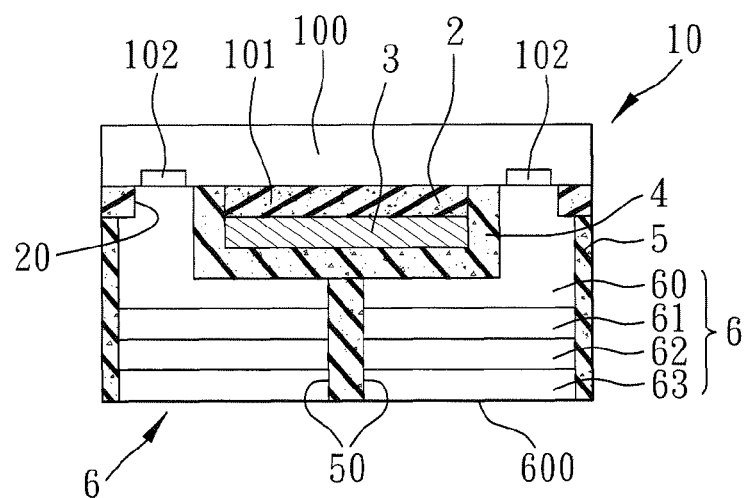
FIGS. 1 to 5 are schematic cross-sectional views illustrating consecutive steps of a method for fabricating light emitting diode devices according to the first preferred embodiment of this invention.

Before the present invention is described in greater detail with reference to the accompanying preferred embodiments, it should be noted herein that like elements are denoted by the same reference numerals throughout the disclosure. Besides, in order to show the features of this invention clearly, the elements shown in the drawings are not drawn in actual scale.

FIGS. 1 to 5 illustrate the first preferred embodiment of a method for fabricating light emitting diode devices according to this invention.

Referring to FIG. 1, a plurality of light emitting diode chips 10 (only one is shown in FIG. 1) are prepared. Each of the light emitting diode chips 10 includes: a semiconductor unit 100 that has p-type and n-type electrode regions; at least two electrodes 102 that are disposed on an electrode-mounting surface 101 of the semiconductor unit 100 and that are connected respectively and electrically to the p-type and n-type electrode regions; a light-transmissive insulating layer 2 that is disposed on the electrode-mounting surface 101 and that has two via holes 20 each of which exposes a respective one of the two electrodes 102; a reflective metal layer 3 disposed on a portion of the light-transmissive insulating layer 2 corresponding to the p-type electrode region; a protective insulating layer 4 that is disposed on the reflective metal layer 3 and that extends to the electrode-mounting surface 101; a conductor-receiving insulating layer 5 that has two conductor-receiving holes 50 respectively in communication with the via holes 20; and two conductor units 6 that are formed respectively in the conductor-receiving holes 50 and are connected electrically and respectively to the two electrodes 102.

Each of the conductor units 6 may be constituted by a single material, or by at least two materials. The selection of the materials of the conductor units 6 should take into consideration the heat-dissipation, electrical conduction, and eutectic properties of the material. In this embodiment, each of the conductor units 6 is constituted by: a first conductor 60 made of a material selected from copper, graphitized diamond, silicon carbide, aluminum, zinc, silver, and the like; a second conductor 61 made of a material selected from chromium, copper, titanium, graphitized diamond, silicon carbide, aluminum, zinc, silver, and the like; a third conductor 62 made of a material selected from nickel, chromium, copper, and the like; and a fourth conductor 63 made of a material selected from nickel, gold, and the like. Preferably, the first conductor 60 is made of a material selected from silver, aluminum, and an alloy thereof; the second conductor is made of a material selected from chromium, titanium, copper, and alloys thereof; the third conductor 62 is made of a material selected from nickel, copper, chromium, and alloys thereof; and the fourth conductor 63 is made of a material selected from nickel, gold, and an alloy thereof.

Figure 2:
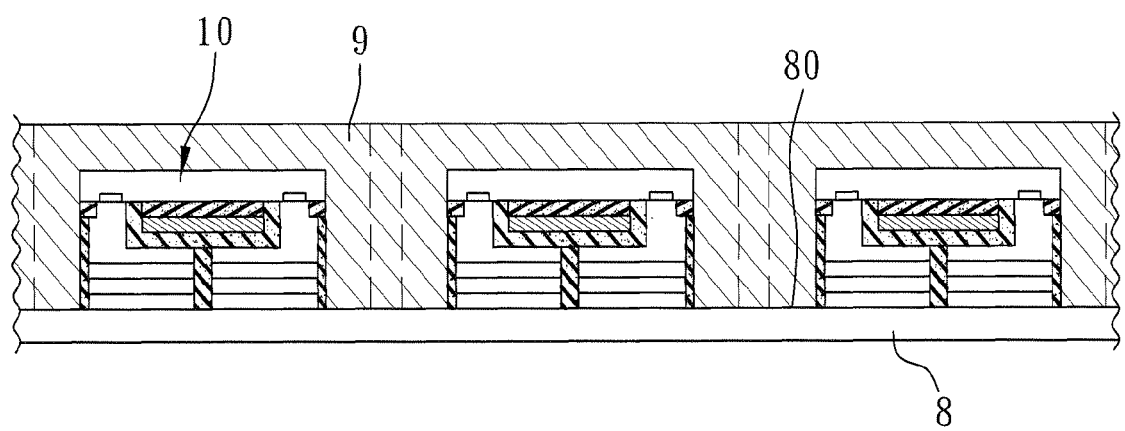
Figure 3:
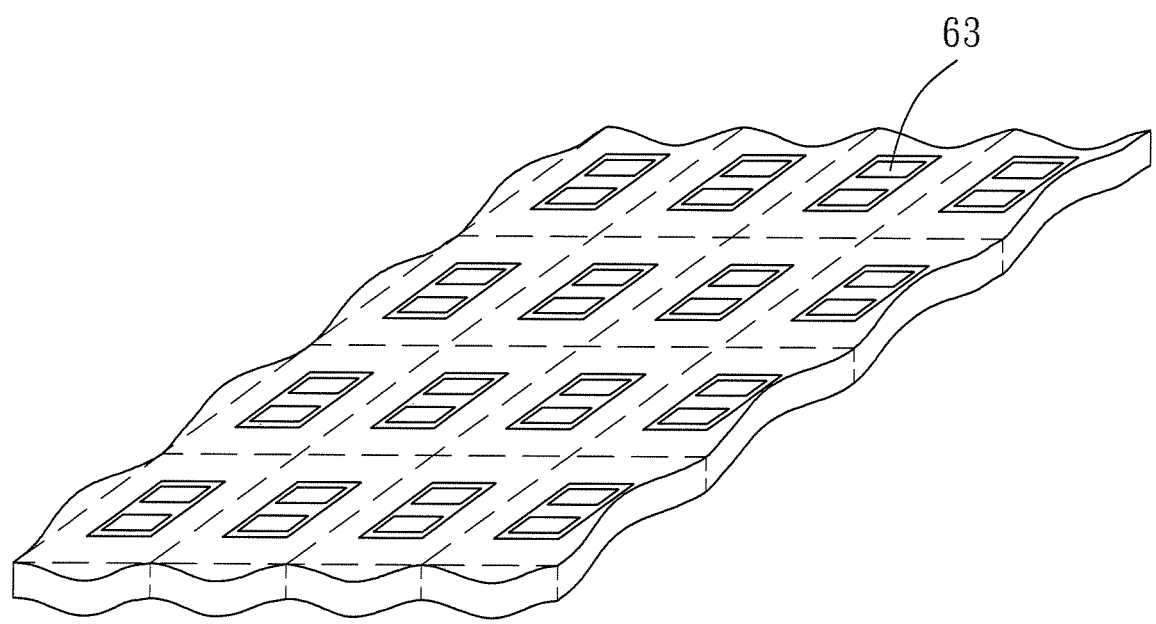

Referring to FIG. 2, the light emitting diode chips 10 are arranged on a supporting face 80 of a supporting body 8 in a matrix. Thereafter, a light-transmissive envelope layer 9 is formed over the supporting face 80 of the supporting body 8 so as to cover all of the light emitting diode chips 10. In this embodiment, the light-transmissive envelope layer 9 covers a surface of each of the light emitting diode chips 10 opposite to the electrode-mounting surface 101, and extends to cover outer lateral surfaces of each of the light emitting diode chips 10. It should be noted that the light-transmissive envelope layer 9 is doped with a fluorescence powder, and thus, when the light emitting diode chips 10 are operated, the light emitting diode device of this invention can emit light with a desired color. After forming the light-transmissive envelope layer 9, the supporting body 8 is removed to expose and permit the fourth conductor 63 of the conductor units 6 to connect to an external circuit (see FIG. 3).

Referring to FIGS. 13 to 18, the conductor units 6 can be independently formed in various shapes.

Next, a protective layer 5A is formed over a surface where the light-transmissive envelope layer 9 and the conductor units 6 are flush with each other (see FIG. 4) so as to cover the conductor units 6 of all of the light emitting diode chips 10. The protective layer 5A includes a plurality of conductor-exposing holes 50A that expose the conductor units 6. Then, a conductive material is formed in the conductor-exposing holes 50A to form a plurality of conductive layers 6A and to electrically connect to the conductor units 6. In other words, the conductive layers 6A are formed respectively on the conductor units 6 and extend to the light-transmissive envelope layer 9. Finally, a cutting process is performed to obtain the light emitting diode devices each having at least one of the light emitting diode chips 10 shown in FIG. 5.

It should be noted that each of the conductive layers 6A has a layer surface 600A facing an unit surface 600 of a respective one of the conductor units 6, the layer surface 600A having a greater area than that of the unit surface 600. Thus, mounting of the light emitting diode device on other devices may be facilitated.

Besides, the arrangement of the light emitting diode chips 10 on the supporting face 80 of the supporting body 8 is conducted in accordance with the standard dimensions for LED SMD operation, such as the specification known as 0603/0902/0201/01005 etc.

Figure 4:
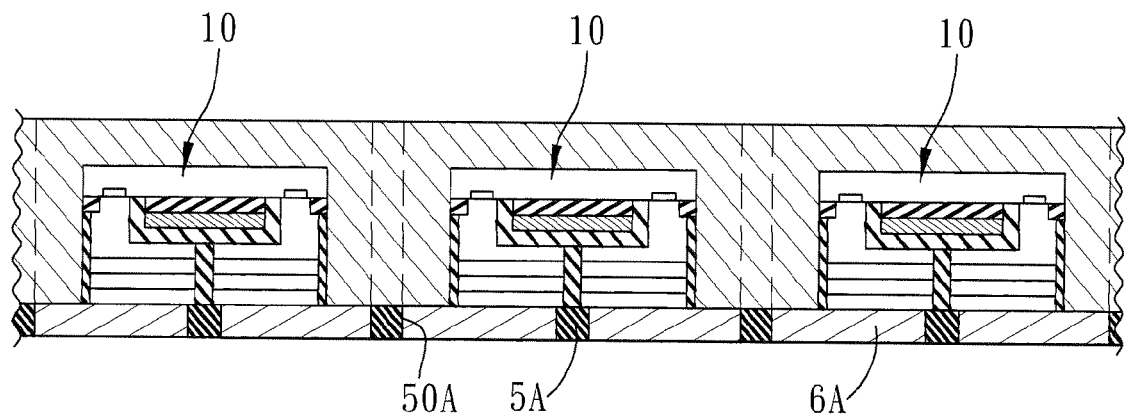
Figure 5:
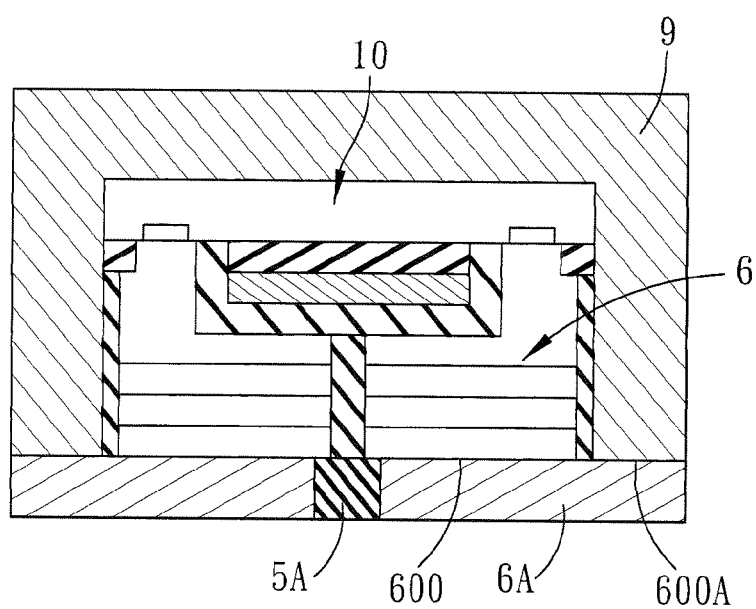
Figure 6:
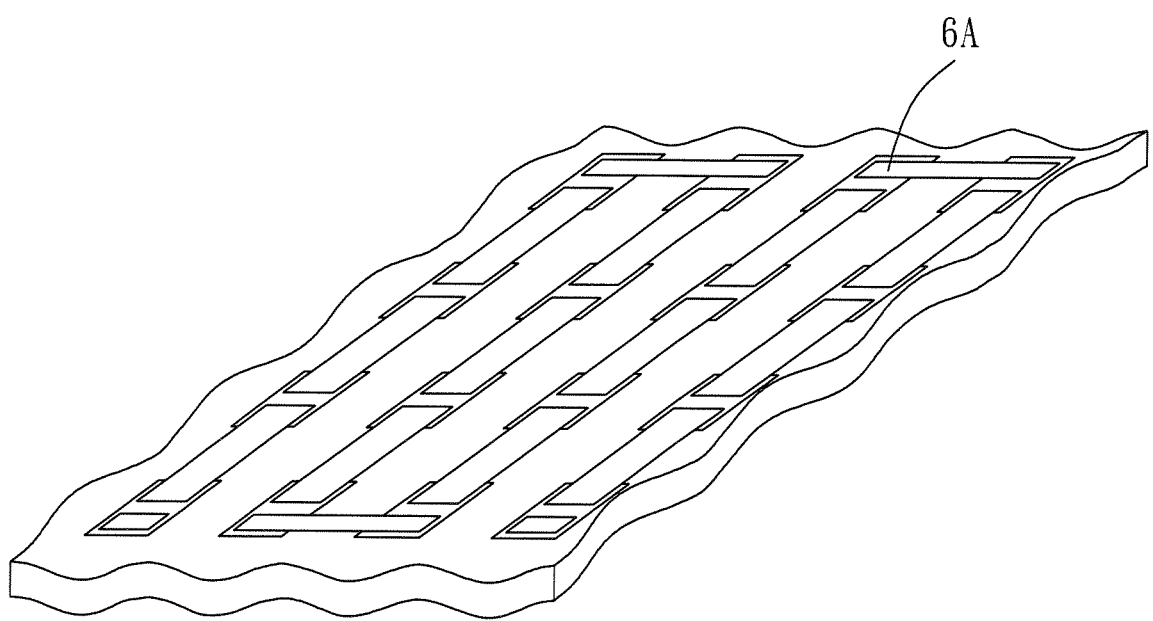
FIG. 6 is a fragmentary perspective view illustrating a modified step in the method for fabricating the first preferred embodiment of the light emitting diode device.

FIG. 6 illustrates a modification of the step shown in FIG. 4. In FIG. 6, each of the conductor-exposing holes 50A of the protective layer 5A exposes at least two conductor units 6 that reside in at least two neighboring light emitting diode chips 10. Therefore, after the conductive layers 6A are formed, the electrodes 102 of the light emitting diode chips 10, which are electrically connected to the p-type and n-type electrode regions, are electrically interconnected to each other in series and/or parallel through the conductive layers 6A. The cutting process is performed to obtain an AC/DC 100-130V light emitting diode module that includes at least two light emitting diode chips 10, or an AC/DC 200-240V light emitting diode module that includes at least two light emitting diode chips 10.

Figure 7:
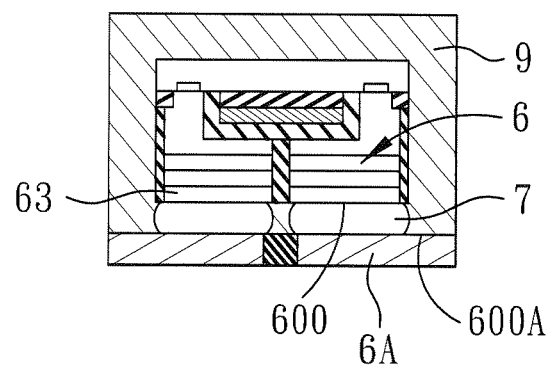
FIG. 7 is a cross-sectional view of the second preferred embodiment of a light emitting diode device according to this invention.

FIG. 7 illustrates the second preferred embodiment of a light emitting diode device according to this invention.

The second preferred embodiment differs from the first preferred embodiment in that each of the light emitting diode chips 10 of the second preferred embodiment further comprises two solder balls 7 each of which is disposed between the fourth conductor 63 of one of the conductor units 6 and a respective one of the conductive layers 6A.

Figure 8:
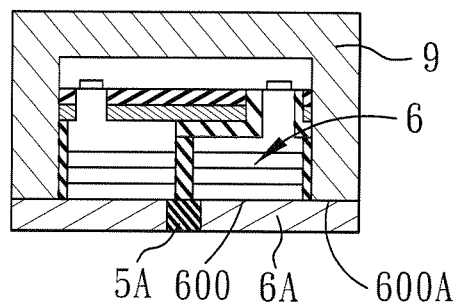
FIG. 8 is a cross-sectional view of the third preferred embodiment of a light emitting diode device according to this invention.

FIG. 8 illustrates the third preferred embodiment of a light emitting diode device according to this invention. The third preferred embodiment differs from the first preferred embodiment in the structure of the light emitting diode chip 10A.

Figure 9:
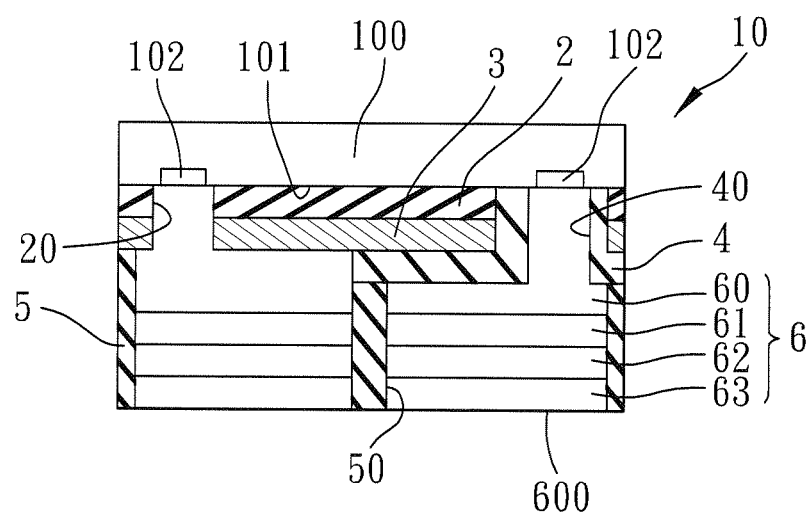
FIG. 9 is a cross-sectional view of a light emitting diode chip of the light emitting diode device shown in FIG. 8.

Referring to FIG. 9, the light emitting diode chip 10A in the third preferred embodiment includes: a semiconductor unit 100 that has p-type and n-type electrode regions; at least two electrodes 102 that are disposed on an electrode-mounting surface 101 of the semiconductor unit 100 and that are connected respectively and electrically to the p-type and n-type electrode regions; a light-transmissive insulating layer 2 that is disposed on the electrode-mounting surface 101 and that has two via holes 20 each of which exposes a respective one of the two electrodes 102; a reflective metal layer 3 disposed on the light-transmissive insulating layer 2; a protective insulating layer 4 that is disposed on a portion of the reflective metal layer 3 corresponding to the n-type electrode region, and that has an electrode-exposing hole 40 to expose one of the electrodes 102 at the n-type electrode region; a conductor-receiving insulating layer 5 that has two conductor-receiving holes 50 respectively in communication with the via holes 20; and two conductor units 6 that are formed respectively in the conductor-receiving holes 50 and are connected electrically and respectively to the two electrodes 102.

Similar to the first preferred embodiment, each of the conductor units 6 in the third preferred embodiment is constituted by the first to fourth conductors 60, 61, 62, 63. Of course, the conductor units 6 may be constituted by any numbers of the conductors.

Figure 10:
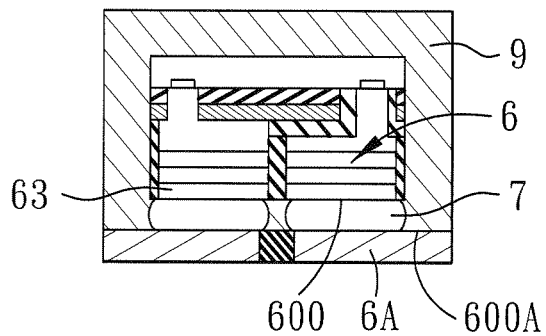
FIG. 10 is a cross-sectional view of the fourth preferred embodiment of a light emitting diode device according to this invention.

FIG. 10 illustrates the fourth preferred embodiment of the light emitting diode device according to this invention. The fourth preferred embodiment differs from the third preferred embodiment in that two solder balls 7 are formed in each of the light emitting diode chips 10 before forming the light-transmissive envelope layer 9. Each of the solder balls 7 is disposed between the fourth conductor 63 of one of the conductor units 6 and a respective one of the conductive layers 6A.

Figure 11:
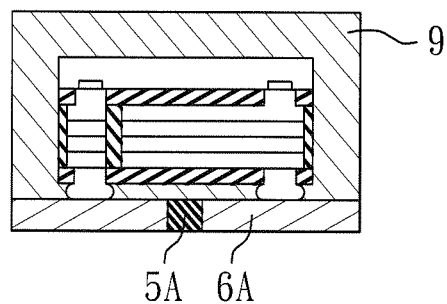
FIG. 11 is a cross-sectional view of the fifth preferred embodiment of a light emitting diode device according to this invention.

FIG. 11 illustrates the fifth preferred embodiment of a light emitting diode device according to this invention. The third preferred embodiment differs from the first preferred embodiment in the structure of the light emitting diode chip 10B.

Figure 12:
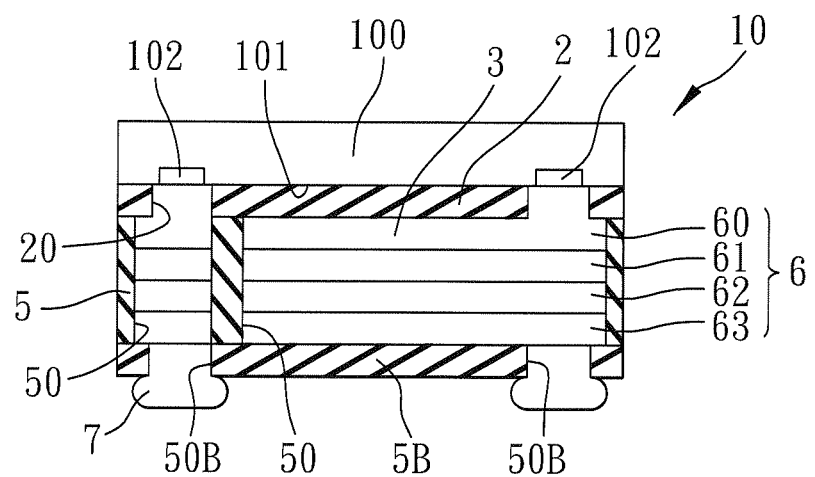
FIG. 12 is a cross-sectional view of alight emitting diode chip of the light emitting diode device shown in FIG. 11.
Figure 13:
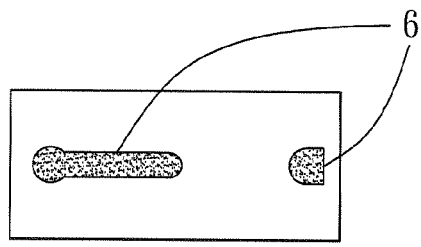
FIGS. 13 to 18 illustrate examples of conductor units suitable for use in the light emitting diode device of this invention.
Figure 16:
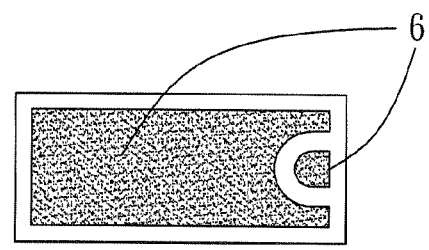
Figure 14:
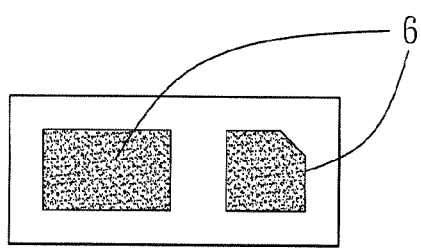
Figure 17:
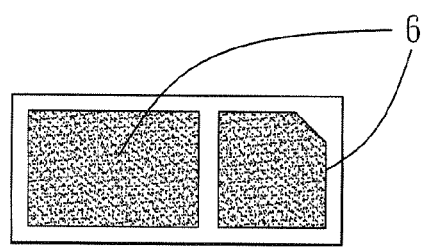
Figure 15:
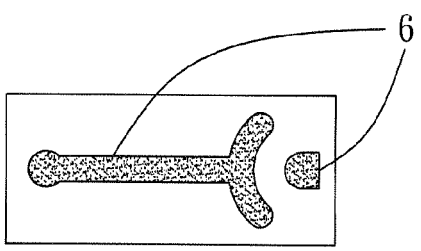
Figure 18:
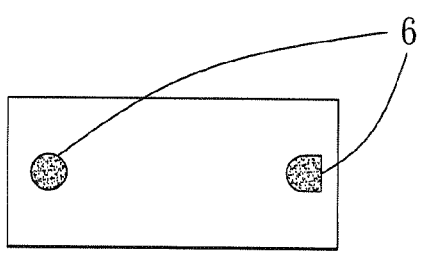

Referring to FIG. 12, the light emitting diode chip 10B in the fifth preferred embodiment includes: a semiconductor unit 100 that has p-type and n-type electrode regions; at least two electrodes 102 that are disposed on an electrode-mounting surface 101 of the semiconductor unit 100 and that are connected respectively and electrically to the p-type and n-type electrode regions; a light-transmissive insulating layer 2 that is disposed on the electrode-mounting surface 101 and that has two via holes 20 each of which exposes a respective one of the two electrodes 102; a conductor-receiving insulating layer 5 that is formed on the light-transmissive insulating layer 2 and that has two conductor-receiving holes 50 respectively in communication with the via holes 20; two conductor units 6 that are formed respectively in the conductor-receiving holes 50 and are connected electrically and respectively to the two electrodes 102; a passivation layer 5B that is disposed on the conductor-receiving insulating layer 5 and that has two conductor-exposing holes 50B to partially and respectively expose the conductor units 6; and two solder balls 7 that are respectively and electrically connected to the conductor units 6 through the conductor-exposing holes 50B.

Similar to the first preferred embodiment, each of the conductor units 6 in the fifth preferred embodiment is constituted by the first to fourth conductors 60, 61, 62, 63. Of course, the conductor units 6 may be constituted by any numbers of the conductors.

In this embodiment, one of the conductor-receiving holes 50, which is connected to the electrode 102 in the p-type electrode region, exposes a portion of the light-transmissive insulating layer 2 situated above the p-type electrode region so that one of the conductor units 6 formed in said one of the conductor-receiving holes 50 is able to serve as a reflective metal layer.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light emitting diode device, comprising:
   at least one light emitting diode chip, which includes a semiconductor unit that has p-type and n-type electrode regions, two electrodes that are disposed on an electrode-mounting surface of said semiconductor unit and that are connected respectively and electrically to said p-type and n-type electrode regions, a light-transmissive insulating layer that is disposed on said electrode-mounting surface and that has two via holes each of which exposes a respective one of said two electrodes, a reflective metal layer disposed on a portion of said light-transmissive insulating layer corresponding to said p-type electrode region, a protective insulating layer that is disposed on said reflective metal layer and that extends to said electrode-mounting surface, a conductor-receiving insulating layer that has two conductor-receiving holes respectively in communication with said via holes, and two conductor units that are formed respectively in said conductor-receiving holes and are connected electrically and respectively to said two electrodes; and
   a light-transmissive envelope layer that covers a surface of said light emitting diode chip opposite to said electrode-mounting surface, that extends to cover outer lateral surfaces of said light emitting diode chip, and that is doped with a fluorescence powder.

2. The light emitting diode device of claim 1, further comprising two conductive layers formed respectively on said conductor units and extending to said light-transmissive envelope layer at said outer lateral surfaces of said light emitting diode chip, each of said conductive layers having a layer surface facing an unit surface of a respective one of said conductor units, said layer surface having a greater area than that of said unit surface.

3. The light emitting diode device of claim 2, which comprises a plurality of said light emitting diode chips, wherein said electrodes, which are electrically connected to said p-type and n-type electrode regions, are electrically interconnected to each other in series and/or parallel through said conductive layers such that said light emitting diode chips are formed into an AC/DC 100-130V light emitting diode module, or an AC/DC 200-240V light emitting diode module.

4. The light emitting diode device of claim 2, further comprising a solder ball disposed between one of said conductor units and a respective one of said conductive layers.

5. The light emitting diode device of claim 1, wherein each of said conductor units is constituted by: a first conductor made of a material selected from silver, aluminum, and an alloy thereof; a second conductor made of a material selected from chromium, titanium, copper, and alloys thereof; a third conductor made of a material selected from nickel, copper, chromium, and alloys thereof; and a fourth conductor made of a material selected from nickel, gold, and an alloy thereof.

6. A light emitting diode device, comprising:
   at least one light emitting diode chip, which includes a semiconductor unit that has p-type and n-type electrode regions, two electrodes that are disposed on an electrode-mounting surface of said semiconductor unit and that are connected respectively and electrically to said p-type and n-type electrode regions, a light-transmissive insulating layer that is disposed on said electrode-mounting surface and that has two via holes each of which exposes a respective one of said two electrodes, a reflective metal layer disposed on said light-transmissive insulating layer, a protective insulating layer that is disposed on a portion of said reflective metal layer corresponding to said n-type electrode region, and that has an electrode-exposing hole to expose one of said electrodes at said n-type electrode region, a conductor-receiving insulating layer that has two conductor-receiving holes respectively in communication with said via holes, and two conductor units that are formed respectively in said conductor-receiving holes and are connected electrically and respectively to said two electrodes; and
   a light-transmissive envelope layer that covers a surface of said light emitting diode chip opposite to said electrode-mounting surface, that extends to cover outer lateral surfaces of said light emitting diode chip, and that is doped with a fluorescence powder.

7. The light emitting diode device of claim 6, further comprising two conductive layers formed respectively on said conductor units and extending to said light-transmissive envelope layer at said outer lateral surfaces of said light emitting diode chip, each of said conductive layers having a layer surface facing an unit surface of a respective one of said conductor units, said layer surface having a greater area than that of said unit surface.

8. The light emitting diode device of claim 7, which comprises a plurality of said light emitting diode chips, wherein said electrodes, which are electrically connected to said p-type and n-type electrode regions, are electrically interconnected to each other in series and/or parallel through said conductive layers such that said light emitting diode chips are formed into an AC/DC 100-130V light emitting diode module, or an AC/DC 200-240V light emitting diode module.

9. The light emitting diode device of claim 7, further comprising a solder ball disposed between one of said conductor units and a respective one of said conductive layers.

10. The light emitting diode device of claim 6, wherein each of said conductor units is constituted by: a first conductor made of a material selected from silver, aluminum, and an alloy thereof; a second conductor made of a material selected from chromium, titanium, copper, and alloys thereof; a third conductor made of a material selected from nickel, copper, chromium, and alloys thereof; and a fourth conductor made of a material selected from nickel, gold, and an alloy thereof.

11. A light emitting diode device, comprising:
at least one light emitting diode chip, which includes a semiconductor unit that has p-type and n-type electrode regions, two electrodes that are disposed on an electrode-mounting surface of said semiconductor unit and that are connected respectively and electrically to said p-type and n-type electrode regions, a light-transmissive insulating layer that is disposed on said electrode-mounting surface and that has two via holes each of which exposes a respective one of said two electrodes, a conductor-receiving insulating layer that is formed on said light-transmissive insulating layer and that has two conductor-receiving holes respectively in communication with said via holes, two conductor units that are formed respectively in said conductor-receiving holes and are connected electrically and respectively to said two electrodes, a passivation layer that is disposed on said conductor-receiving insulating layer and that has two conductor-exposing holes to partially and respectively expose said conductor units, and two solder balls that are respectively and electrically connected to said conductor units through said conductor-exposing holes; and
a light-transmissive envelope layer that covers a surface of said light emitting diode chip opposite to said electrode-mounting surface, that extends to cover outer lateral surfaces of said light emitting diode chip, and that is doped with a fluorescence powder.

12. The light emitting diode device of claim 11, further comprising two conductive layers formed respectively on said solder balls and extending to said light-transmissive envelope layer at said outer lateral surfaces of said light emitting diode chip, each of said conductive layers having a layer surface facing an unit surface of a respective one of said conductor units, said layer surface having a greater area than that of said unit surface.

13. The light emitting diode device of claim 12, which comprises a plurality of said light emitting diode chips, wherein said electrodes, which are electrically connected to said p-type and n-type electrode regions, are electrically interconnected to each other in series and/or parallel through said conductive layers such that said light emitting diode chips are formed into an AC/DC 100-130V light emitting diode module, or an AC/DC 200-240V light emitting diode module.

14. The light emitting diode device of claim 11, wherein each of said conductor units is constituted by: a first conductor made of a material selected from silver, aluminum, and an alloy thereof; a second conductor made of a material selected from chromium, titanium, copper, and alloys thereof; a third conductor made of a material selected from nickel, copper, chromium, and alloys thereof; and a fourth conductor made of a material selected from nickel, gold, and an alloy thereof.

15. A method for fabricating light emitting diode devices, comprising:
providing a plurality of light emitting diode chips, each of which includes a semiconductor unit that has p-type and n-type electrode regions, two electrodes that are disposed on an electrode-mounting surface of the semiconductor unit and that are connected respectively and electrically to the p-type and n-type electrode regions, a light-transmissive insulating layer that is disposed on the electrode-mounting surface and that has two via holes each of which exposes a respective one of the two electrodes, a conductor-receiving insulating layer that is formed on the light-transmissive insulating layer and that has two conductor-receiving holes respectively in communication with the via holes, and two conductor units that are formed respectively in the conductor-receiving holes and are connected electrically and respectively to the two electrodes;
arranging the light emitting diode chips on a supporting face of a supporting body in a matrix;
forming over the supporting face of the supporting body a light-transmissive envelope layer that is doped with a fluorescence powder so as to cover all of the light emitting diode chips;
removing the supporting body to expose and permit the conductor units to connect to an external circuit; and
performing a cutting process to obtain light emitting diode devices each having at least one of the light emitting diode chips.

16. The method of claim 15, further comprising, before performing the cutting process,
forming a protective layer over a surface where the light-transmissive envelope layer and the conductor units are flush with each other, the protective layer including a plurality of conductor-exposing holes that expose the conductor units; and
forming a conductive material in the conductor-exposing holes to electrically connect to the conductor units.

17. A method for fabricating light emitting diode devices, comprising:
providing a plurality of light emitting diode chips, each of which includes a semiconductor unit that has p-type and n-type electrode regions, two electrodes that are disposed on an electrode-mounting surface of the semiconductor unit and that are connected respectively and electrically to the p-type and n-type electrode regions, a light-transmissive insulating layer that is disposed on the electrode-mounting surface and that has two via holes each of which exposes a respective one of the two electrodes, a reflective metal layer disposed on the light-transmissive insulating layer, a protective insulating layer that is disposed on a portion of the reflective metal layer corresponding to the n-type electrode region, and that has an electrode-exposing hole to expose one of the electrodes at the n-type electrode region, a conductor-receiving insulating layer that has two conductor-receiving holes respectively in communication with the via holes, and two conductor units that are formed respectively in the conductor-receiving holes and are connected electrically and respectively to the two electrodes;

arranging the light emitting diode chips on a supporting face of a supporting body in a matrix;

forming over the supporting face of the supporting body a light-transmissive envelope layer that is doped with a fluorescence powder so as to coverall of the light emitting diode chips;

removing the supporting body to expose and permit the conductor units to connect to an external circuit; and performing a cutting process to obtain light emitting diode devices each having at least one of the light emitting diode chips.

18. The method of claim 17, further comprising, before performing the cutting process, forming a protective layer over a surface where the light-transmissive envelope layer and the conductor units are flush with each other, the protective layer including a plurality of conductor-exposing holes that expose the conductor units; and forming a conductive material in the conductor-exposing holes to electrically connect to the conductor units.

19. A method for fabricating light emitting diode devices, comprising:

providing a plurality of light emitting diode chips, each of which includes a semiconductor unit that has p-type and n-type electrode regions, two electrodes that are disposed on an electrode-mounting surface of the semiconductor unit and that are connected respectively and electrically to the p-type and n-type electrode regions, a light-transmissive insulating layer that is disposed on the electrode-mounting surface and that has two via holes each of which exposes a respective one of the two electrodes, a conductor-receiving insulating layer that is formed on the light-transmissive insulating layer and that has two conductor-receiving holes respectively in communication with the via holes, two conductor units that are formed respectively in the conductor-receiving holes and are connected electrically and respectively to the two electrodes, a passivation layer that is disposed on the conductor-receiving insulating layer and that has two conductor-exposing holes to partially and respectively expose the electrodes, and two solder balls that are connected electrically and respectively to the conductor units through the conductor-exposing holes, one of the conductor-receiving holes, which is connected to the electrode in the p-type electrode region, exposing a portion of the light-transmissive insulating layer situated above the p-type electrode region so that one of the conductor units formed in said one of the conductor-receiving holes is able to serve as a reflective metal layer;

arranging the light emitting diode chips on a supporting face of a supporting body in a matrix;

forming over the supporting face of the supporting body a light-transmissive envelope layer that is doped with a fluorescence powder so as to cover all of the light emitting diode chips;

removing the supporting body to expose and permit the conductor units to connect to an external circuit; and performing a cutting process to obtain light emitting diode devices each having at least one of the light emitting diode chips.

20. The method of claim 19, further comprising, before performing the cutting process, forming a protective layer over a surface where the light-transmissive envelope layer and the conductor units are flush with each other, the protective layer including a plurality of conductor-exposing holes that expose the conductor units; and forming a conductive material in the conductor-exposing holes to electrically connect to the conductor units.

* * * * *